us010571516B2

United States Patent
Sandhu et al.

(10) Patent No.: US 10,571,516 B2
(45) Date of Patent: Feb. 25, 2020

(54) CMOS PROCESS SKEW SENSOR

(71) Applicant: ARM Limited, Cambridge (GB)

(72) Inventors: Bal S. Sandhu, Fremont, CA (US); George McNeil Lattimore, Austin, TX (US)

(73) Assignee: ARM Limited, Cambridge (GB)

( * ) Notice: Subject to any disclaimer, the term of this patent is extended or adjusted under 35 U.S.C. 154(b) by 64 days.

(21) Appl. No.: 15/691,722

(22) Filed: Aug. 30, 2017

(65) Prior Publication Data
US 2019/0064259 A1    Feb. 28, 2019

(51) Int. Cl.
*G01R 31/3187* (2006.01)
*G01R 31/28* (2006.01)
*H03K 5/24* (2006.01)
H01L 21/8238 (2006.01)
H03M 1/66 (2006.01)
G06F 11/25 (2006.01)

(52) U.S. Cl.
CPC .......... *G01R 31/2884* (2013.01); *H03K 5/24* (2013.01); *G06F 11/25* (2013.01); *H01L 21/8238* (2013.01); *H03M 1/66* (2013.01)

(58) Field of Classification Search
CPC ...... G01R 31/2884; H03K 5/24; H03K 5/151; H03K 5/1565; H03K 5/133; H03K 3/0315; H03K 3/356139; H01L 21/8238; G06F 11/25; H03M 1/66; H03M 1/0836; H03M 1/1009; H03M 1/1095; H03M 1/662

See application file for complete search history.

(56) References Cited

U.S. PATENT DOCUMENTS

| 9,865,347 | B2* | 1/2018 | Jien | G11C 13/0069 |
| 2008/0157860 | A1* | 7/2008 | Kim | G11C 5/145 327/543 |
| 2009/0146700 | A1* | 6/2009 | Kim | H03K 5/1565 327/144 |
| 2010/0237950 | A1* | 9/2010 | Cao | H03F 1/301 330/296 |
| 2010/0327921 | A1* | 12/2010 | Shih | H03K 5/151 327/141 |
| 2015/0022089 | A1* | 1/2015 | Takata | H05B 33/0815 315/122 |
| 2015/0301551 | A1* | 10/2015 | Childs | H02M 3/156 323/313 |
| 2017/0279441 | A1* | 9/2017 | Adachi | H03K 5/1565 |

* cited by examiner

*Primary Examiner* — Thang X Le
(74) *Attorney, Agent, or Firm* — Pramudji Law Group PLLC; Ari Pramudji

(57) ABSTRACT

Various implementations described herein are directed to an integrated circuit. The integrated circuit may include converter circuitry that operates to provide a drive current. The integrated circuit may include process detector circuitry having multiple drive strength devices that are driven by the drive current from the converter circuitry. The multiple drive strength devices may provide multiple drive strength signals based on the drive current. The integrated circuit may include comparator circuitry having a comparator that receives the multiple drive strength signals from the multiple drive strength devices, detects a voltage difference between the multiple drive strength signals, and provides an output signal based on the detected voltage difference.

20 Claims, 7 Drawing Sheets

CMOS PROCESS SKEW SENSOR

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Generally, an integrated circuit (IC) having components of a computing system provided on a single chip typically refers to system on a chip (SoC). The SoC is fabricated to include digital, analog, mixed-signal, and/or radio-frequency (RF) capability on a single chip substrate. SoC applications are useful for mobile electronic devices due to their low power consumption and minimal area impact in embedded systems. Due to a denser layout, SoC devices may have a higher defect density than other types of logic circuits, and to improve operating functionality SoC devices, the SoC devices should be tested to evaluate process variation of the SoC devices.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations of a process skew sensor (or process skew detector) will now be described in greater detail herein with reference to FIGS. 1-8.

Figure 1:
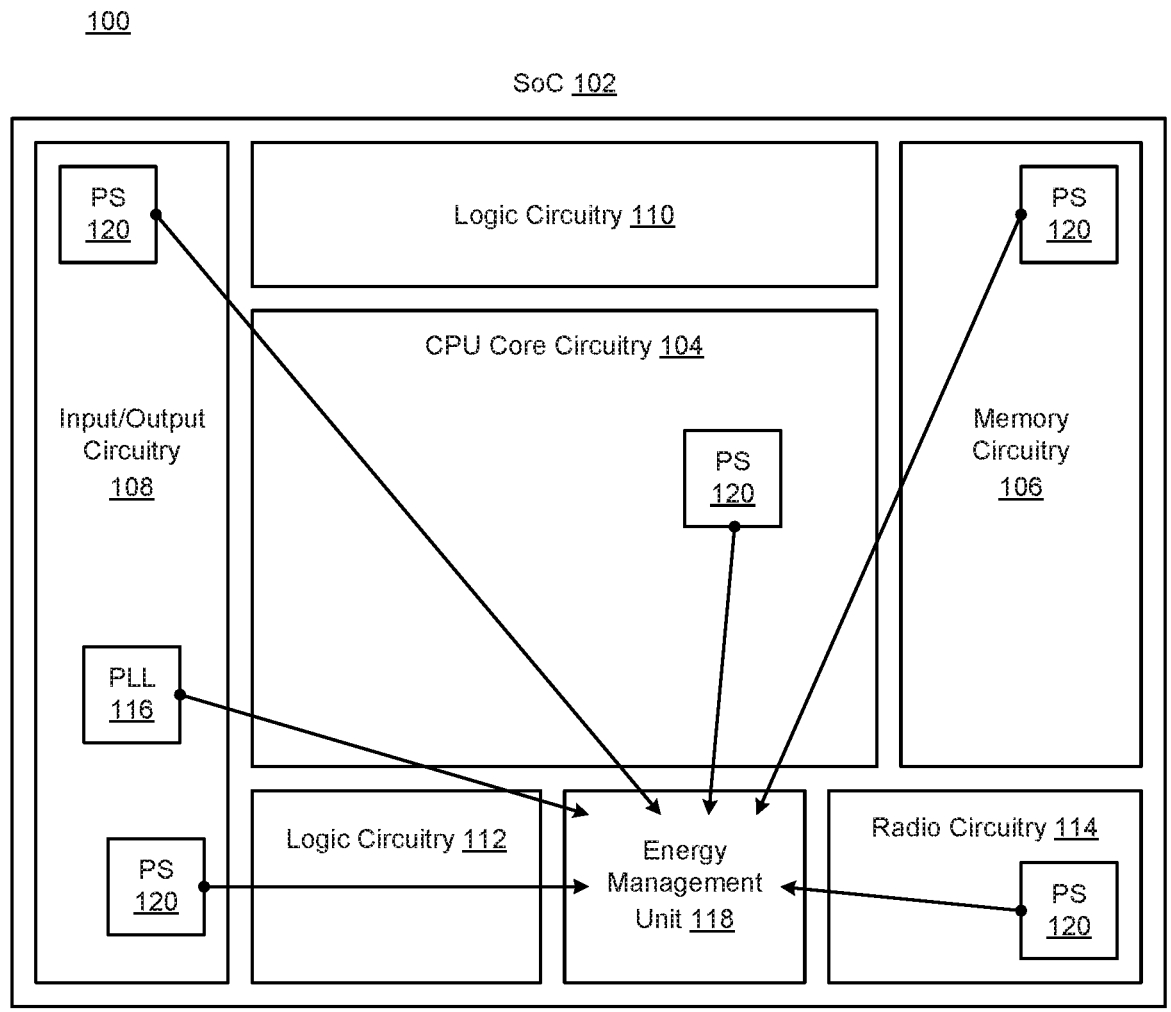
FIG. 1 illustrates a block diagram of chip circuitry having process sensors in accordance with various implementations described herein.

FIG. 1 illustrates a block diagram 100 of system-on-a-chip (SoC) circuitry 102 having process sensors 120 in accordance with implementations described herein.

The SoC circuitry 102 may be implemented as an integrated circuit (IC) having various core component circuitry including CPU core circuitry 104, memory circuitry 106 (e.g., SRAM and/or other types of memory), input/output (IO) circuitry 108, various logic circuitry 110, 112, radio circuitry 114 (e.g., radio frequency (RF) components), and energy management circuitry 118. In some instances, some of the circuitry blocks, such as, e.g., the IO circuitry 108 may include additional circuitry, such as, e.g., phase lock loop (PLL) circuitry 116. Further, the SoC circuitry 102 may be used as an embedded system for various electronic and mobile applications. In some instances, the SoC circuitry 102 and components thereof may be implemented as a single chip.

The memory circuitry 106 may include a memory cell array having a plurality of memory cells arranged in a two-dimensional (2D) array with rows and columns. The memory circuitry 106 may be implemented as an IC, and the memory circuitry 106 may include support circuitry, such as, e.g., output multiplexing circuitry. The memory cells may be referred to as bitcells, and each memory cell may be configured to store at least one data bit value (e.g., related to storing logic 0 or 1). The memory cells of the memory cell array may be implemented with SRAM circuitry. In some instances, each memory cell may include a multi-transistor SRAM cell, including various types of SRAM cells, such as, e.g., 6T CMOS SRAM and/or other types of CMOS SRAM cells, such as, e.g., 4T, 8T, 10T or more transistors per bit.

As shown, the SoC circuitry 102 includes mixed-signal building blocks 104, 106, 108, 110, 112, 114, 118 whose performance may be dependent on the behavior of the transistors within each block. These transistors may be either PMOS or NMOS and may have opposite or similar variations that may alter the functionality of some critical building blocks in the CPU, memory, and analog components. To monitor a condition of transistor device behavior on the silicon, process skew sensors 120 may be strategically placed on the SoC circuitry 102, as shown in FIG. 1. Therefore, some of circuitry blocks 104, 106, 108, 114 may include one or more process sensors 120 that may include process sensor (or detector) circuitry with transistors of multiple types (e.g., NMOS, PMOS). The process sensors 120 may be referred to as process detectors. In some instances, the transistors of the process sensor (or detector) circuitry may be manufactured on (or part of) a same wafer, i.e., a same integrated circuit, so that the process detector detects (or senses) skew of the circuitry blocks 104, 106, 108, 114 on the same wafer. The process sensors 120 may be coupled and/or communicate with the energy management unit 118.

In some implementations, detecting (or sensing) process variation may include detecting global complementary metal-oxide-semiconductor (CMOS) process variation of circuitry blocks 104, 106, 108, 114 of the SoC circuitry 102. Further, detecting process variation may include detecting various process points when transistors detect that the process variation has skewed sufficiently to SF, FS, FF, SS process points. This naming convention of the process points refers to a first position and a second position for the process point. For instance, the SF process point refers to detecting, in a first position (S), slower P-type MOS transistors and to detecting, in a second position (F), faster N-type MOS transistors. In another instance, detecting process variation may also include detecting another process point when the second transistors detect that the process variation has skewed sufficiently to an FS process point. In this instance, the FS process point refers to detecting, in the first position (F), faster P-type MOS transistors and to detecting, in the second position (S), slower N-type MOS transistors. This convention of 'S' and 'F' may be used by foundries to model the effect of variations in the manufacturing of MOS transistors. In some instances, at process corners where a particular transistor is slow (S), the threshold voltage (Vt) of the transistor may be modelled as higher than a typical Vt, to thereby include one or more or all manufacturing effects (variations) that may reduce the drain current of the transistor than what may be typically expected. In some other instances, at process corners where a particular transistor is fast (F), the threshold voltage (Vt) of the transistor may be modelled as lower than a typical Vt, to thereby include one or more or all manufacturing effects (variations) that may increase the drain current of transistors to a value higher than what may be typically expected.

Due to dense layout, some circuitry blocks 104, 106, 108, 114 may have a high defect density than other logic circuitry 110, 112 of the SoC circuitry 102. To evaluate yield of the circuitry blocks 104, 106, 108, 114, the process sensors 120 may be used to detect and analyze process variation of circuitry blocks 104, 106, 108, 114. For instance, the process sensors 120 may provide circuitry that provides an output signal, e.g., a digital 1-bit output signal, when the circuitry detects that a global CMOS process has skewed sufficiently to a particular process point, such as, e.g., an SF (slower PMOS/faster NMOS) process point. In some other instances, an FS (faster PMOS/slower NMOS) process point detection may also be utilized with similar topology. Thus, a skewed process sensor IC topology may be provided for embedding in some circuitry blocks 104, 106, 108, 114 that may enhance power, performance, and area (PPA) of the SoC circuitry 102.

Various implementations described herein refer to and are directed to a CMOS process skew sensor that detects the strength of PMOS and NMOS device drive currents in SoC circuitry. The CMOS process skew sensor may include various circuitry, such as, e.g., a sensor to detect SF or FS skew corners (SF=slow P, fast N; FS=fast P, slow N) and/or another sensor to detect FF or SS skew corners so as to determine the magnitude (or rate) of the how fast or slow the silicon is.

Figure 2:
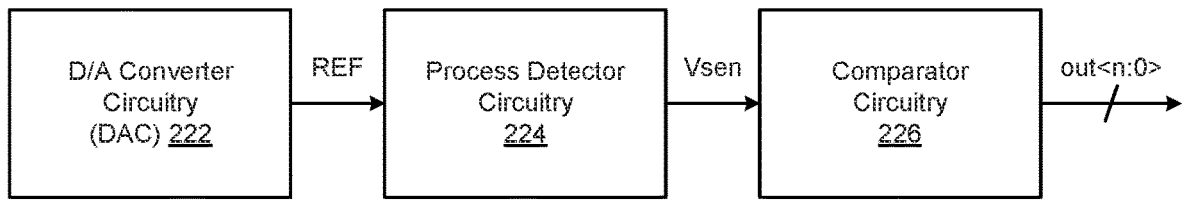
FIGS. 2-3 illustrate various block diagrams of a process sensor in accordance with various implementations described herein.
Figure 3:
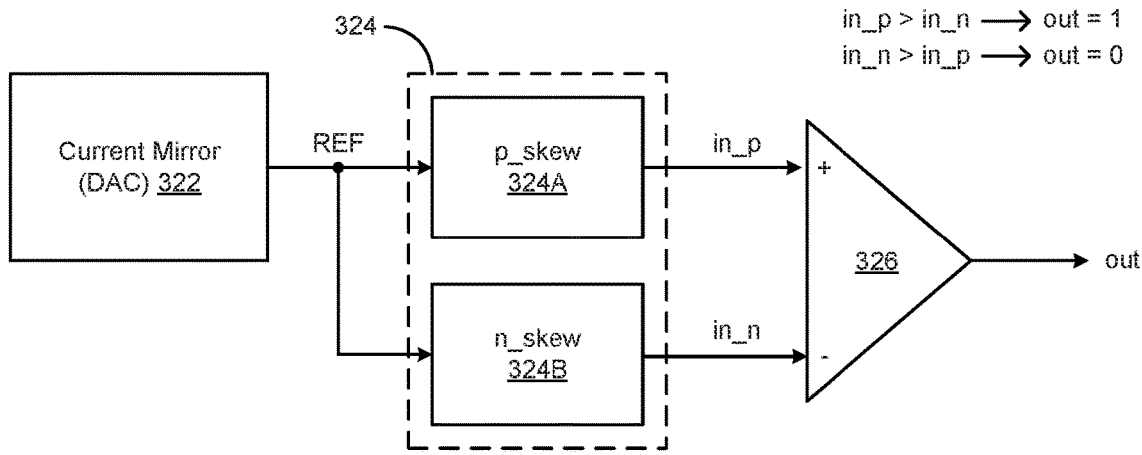

FIGS. 2-3 illustrate various block diagrams of a process sensor in accordance with various implementations described herein. In particular, FIG. 2 illustrates a block diagram 200 of a process sensor 220, and FIG. 3 illustrates another block diagram 300 of another process sensor 320.

As shown in FIG. 2, the process sensor 220 may include converter circuitry 222 that operates to provide a drive current (or drive voltage), such as e.g., a reference current REF (or reference voltage). The converter circuitry 222 may include a digital-to-analog converter (DAC). The process sensor 220 may include process detector circuitry 224 that receives the reference current (or voltage) REF and operates to provide a voltage sensing signal Vsen. The process sensor 220 may include comparator circuitry 226 that receives the voltage sensing signal Vsen and provides one or more output signals out<n:0>.

The process sensor 220 may be referred to as a process skew sensor, and the process skew sensor may be embodied as a complementary metal-oxide-semiconductor (CMOS) process skew sensor. The process sensor 220 may be an implementation of the process sensors 120 of FIG. 1, which may be deployed across the SoC circuitry 102 of FIG. 1. The DAC generates the reference current REF (or reference voltage), and the output of the DAC is provided to the process detector 224. The process detector 224 compares the reference current REF (or reference voltage) with internal detection circuitry and generates the voltage sensing signal Vsen. The voltage sensing signal Vsen is then driven into the comparator circuitry 226, which generates the one or more output signals out<n:0> as desired silicon process skew information.

As shown in FIG. 3, the process sensor 320 may include converter circuitry 322 that operates to provide a drive current, such as, e.g., reference current REF. The converter circuitry 322 may include a digital-to-analog converter (DAC), and the DAC may operate as a current mirror to provide the drive current REF.

The process sensor 320 may include process detector circuitry 324 having multiple drive strength devices 324A, 324B that are driven by the drive current REF from the converter circuitry 322. The multiple drive strength devices 324A, 324B may provide multiple drive strength signals in_p, in_n based on the drive current REF.

The process sensor 320 may include comparator circuitry having a comparator 326 that receives the multiple drive strength signals in_p, in_n from the multiple drive strength devices 324A, 324B, detects a voltage difference between the multiple drive strength signals in_p, in_n, and provides an output signal (out) based on the detected voltage difference. The comparator 326 may be an analog comparator, and the detected voltage difference may be related to a difference in strength between the multiple drive strength signals in_p, in_n, and thereby the output signal (out) may be indicative of the difference in strength between the multiple drive strength signals in_p, in_n. The multiple drive strength devices 324A, 324B may be implemented as multiple process skew detectors, which may include a first process skew detector 324A (p_skew) and a second process skew detector 324B (n_skew) to independently detect the strength of the PMOS and NMOS transistors, respectively.

The comparator 326 receives the first and second drive strength signals in_p, in_n from the multiple drive strength devices 324A, 324B. As shown, if the strength of the drive strength signal in_p from the first process skew detector 324A (p_skew) is stronger than the strength of the drive strength signal in_n from the second process skew detector 324B (n_skew), then the output signal (out) from the comparator 326 is a high voltage signal related to a logic one (1) voltage value. Further, as shown, if the strength of the drive strength signal in_n from the second process skew detector 324B (n_skew) is stronger than the strength of the drive strength signal in_p from the first process skew detector 324A (p_skew), then the output signal (out) of the comparator 326 is a low voltage signal related to a logic zero (0) voltage value.

In reference to FIG. 3, the CMOS process skew sensor uses a current mirror (e.g., DAC 322) to drive two similar (or identical) drive strength devices 324A, 324B where one is a PMOS device 324A (p_skew) and the other is an NMOS device 324B (n_skew) that operate in saturation region. The process skew sensor 320 utilizes the PMOS and NMOS devices 324A, 324B to detect a voltage difference between these two devices 324A, 324B using an analog comparator 326. During operation, if the PMOS device 324A (p_skew) is stronger than the NMOS device 324B (n_skew), then output of the comparator 326 is high. Similarly, if the NMOS device 324B (n_skew) is stronger than the PMOS device 324B (p_skew), then output of the comparator 326 is low.

Figure 4:
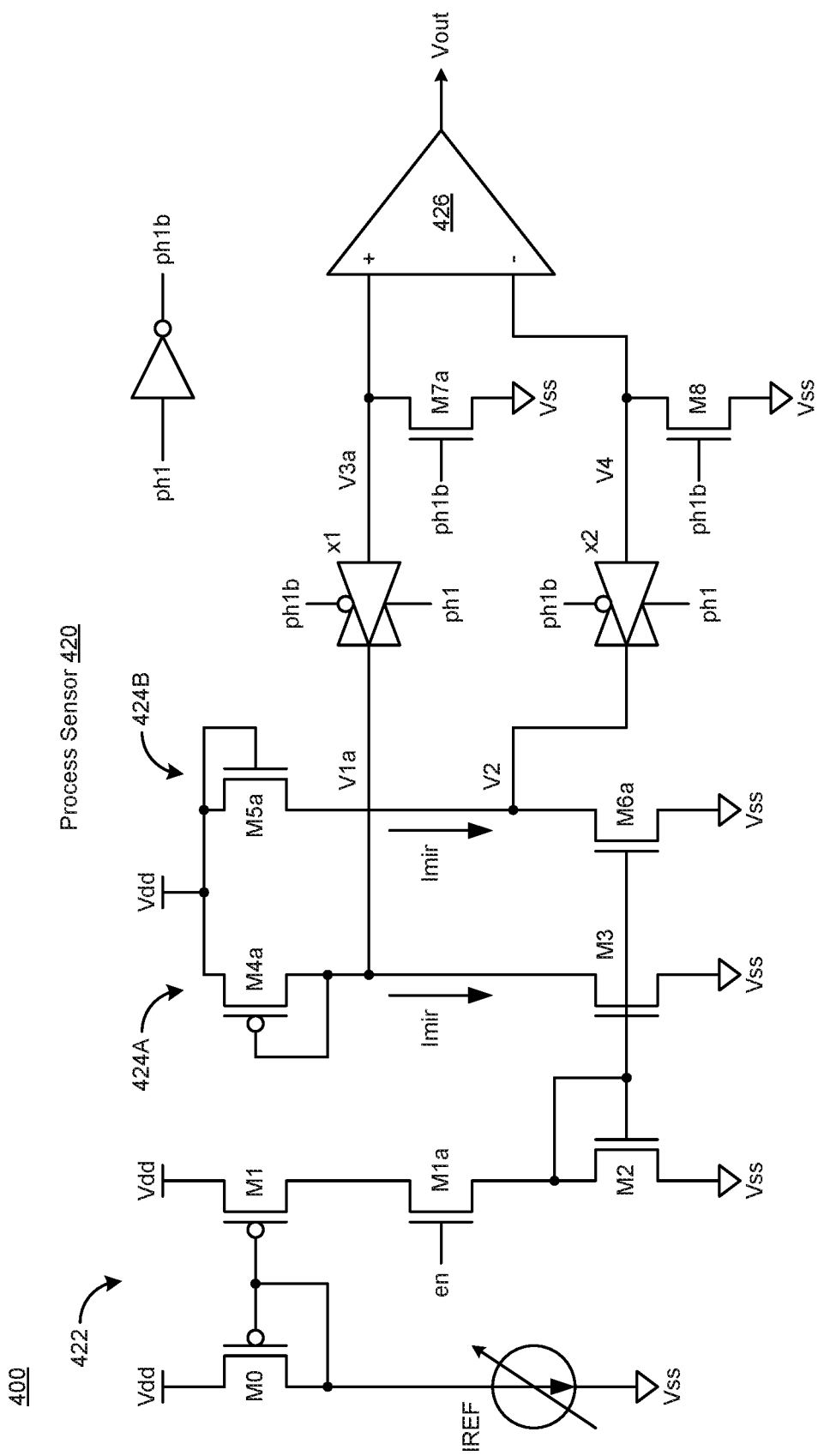
FIGS. 4-5 illustrate various schematic diagrams of a process sensor in accordance with various implementations described herein.
Figure 5:
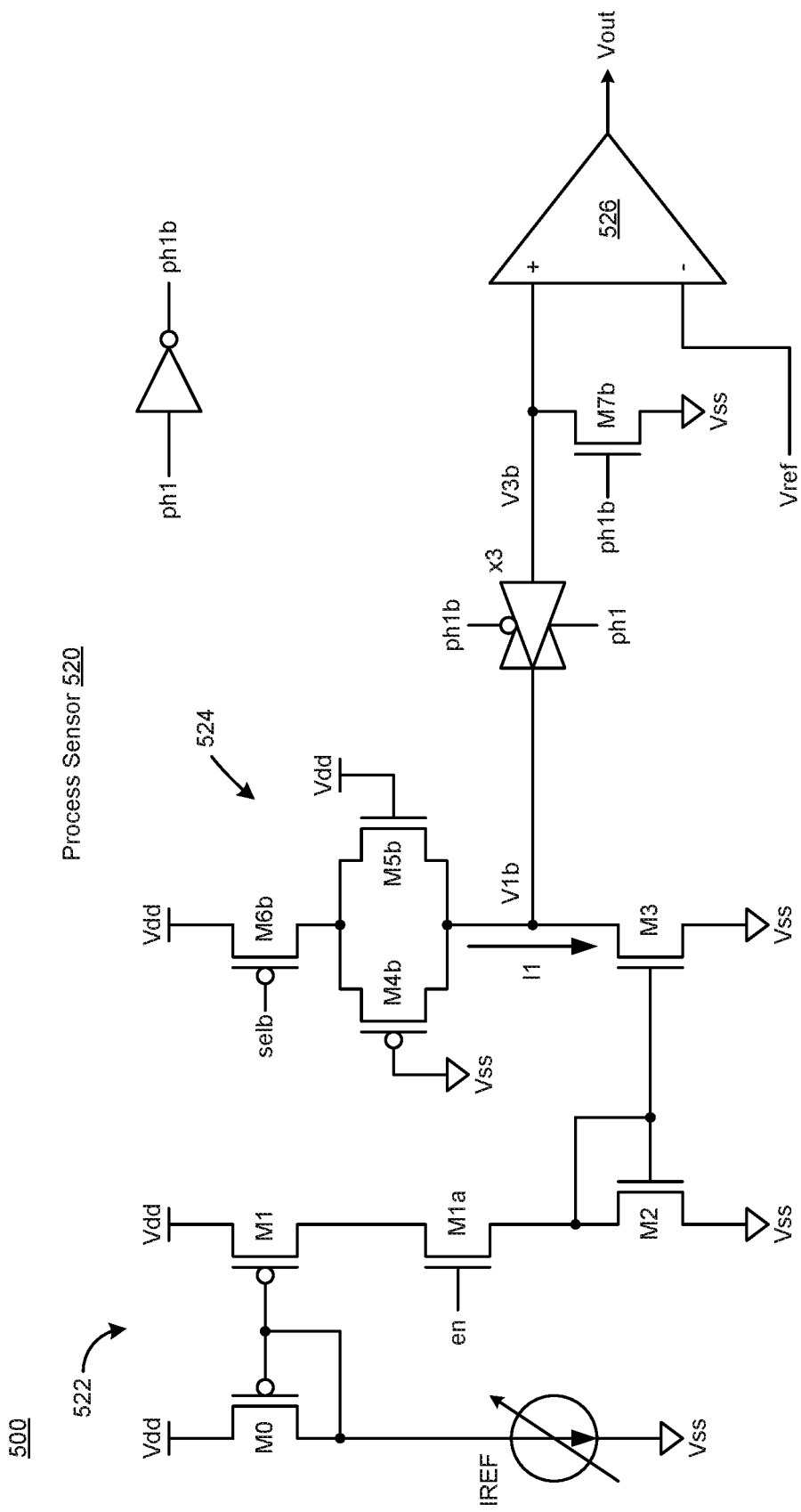

FIGS. 4-5 illustrate schematic diagrams of a process sensor in accordance with various implementations described herein. In particular, FIG. 4 illustrates a schematic diagram 400 of a first process sensor circuit of a process sensor 420, and FIG. 5 illustrates a schematic diagram 500 of a second process sensor circuit of another process sensor 520.

As shown in reference to FIG. 4, the process sensor 420 may include multiple transistors that are arranged to operate as a CMOS PN skew sensor. The process sensors 420, 520 may be referred to as process detectors.

The process sensor 420 may include a current mirror 422. The process sensor 420 may include PMOS transistor M0 that is coupled between a first voltage source Vdd and a second voltage source Vss, such as ground (GND). The process sensor 420 may include a current reference IREF that is coupled between the PMOS transistor M0 and the second voltage source Vss. The PMOS transistor M0 may be coupled as a diode, wherein the gate is coupled to the drain. The process sensor 420 may include multiple transistors M1, M1a, M2 that are coupled together in a stack between the first voltage source Vdd and the second voltage source Vss. The PMOS transistor M1 may be coupled between the first voltage source Vdd and the NMOS transistor M1a, and the gate of the PMOS transistor M1 may be coupled to the gate of the transistor M0. The NMOS transistor M1a may be coupled between the PMOS transistor M1 and the NMOS transistor M2. The NMOS transistor M1a may be activated based on an enable signal (en). The NMOS transistor M2 may be coupled between the NMOS transistor M1a and the second voltage source Vss. The NMOS transistor M2 may be coupled as a diode, wherein the gate is coupled to the drain. The process sensor 420 may include NMOS transistor M3 coupled between PMOS transistor M4a and the second voltage source Vss. The process sensor 420 may include NMOS transistor M6a coupled between NMOS transistor M5a and the second voltage source Vss. Further, the gates of the NMOS transistors M2, M3, M6a may be coupled together.

The process sensor 420 may include the PMOS transistor M4a that is coupled between the first voltage source Vdd and the NMOS transistor M3. The PMOS transistor M4a may be coupled as a diode, wherein the gate is coupled to the drain. The process sensor 420 may include the NMOS transistor M5a that is coupled between the first voltage source Vdd and the NMOS transistor M6a. The NMOS transistor M5a may be coupled as a diode, wherein the gate is coupled to the drain.

The PMOS transistor M4a may operate as a first process skew detector 424A (p_skew) so as to detect a strength of the reference current IREF (i.e., drive current) when the PMOS transistor M4a operates in saturation region. The PMOS transistor M4a (as the first process skew detector 424A) provides a first drive strength signal V1a, V3a to a positive input terminal (+) of the comparator 426 via a CMOS transmission gate x1 based on the detected drive strength of the PMOS transistor M4. The CMOS transmission gate x1 includes an NMOS pass gate and a PMOS pass gate. The signals ph1 and ph1b are clock signals with phase1 and phase1 bar. When ph1=1 and ph1b=0, the transmission gate x1 is open and allows the V1a signal to pass through. When ph1=0 and ph1b=1, the transmission gate x1 is closed and no signal can pass through, and the input signals to the comparator 426 are grounded via NMOS transistors M7a, M8.

The NMOS transistor M5a may operate as a second process skew detector 424B so as to detect a strength of the reference current IREF (i.e., drive current) when the NMOS transistor M5a that operates in saturation region. The NMOS transistor M5a (as the second process skew detector 424B) provides a second drive strength signal V2, V4 to a negative input terminal (−) of the comparator 426 via a CMOS transmission gate x2 based on the detected drive strength of the NMOS transistor M5a. The CMOS transmission gate x2 includes an NMOS pass gate and a PMOS pass gate. The signals ph1 and ph1b are clock signals with phase1 and phase1 bar. When ph1=1 and ph1b=0, the transmission gate x1 is open and allows the V2 signal to pass through. When ph1=0 and ph1b=1, the transmission gate x1 is closed and no signal can pass through, and the input signals to the comparator 426 are grounded via NMOS transistors M7a, M8.

The comparator 426 receives the first drive strength signal from the PMOS transistor M4a and the second drive strength signal form the NMOS transistor M5a. If the strength of the reference current IREF (i.e., drive current) from the PMOS transistor M4a is stronger than the strength of the reference current IREF (i.e., drive current) from the NMOS transistor M5a, then the output signal (Vout) from the comparator 426 is a high voltage signal related to a logic one (1) voltage value. If the strength of the reference current IREF (i.e., drive current) from the NMOS transistor M5a is stronger than the strength of the reference current IREF (i.e., drive current) from the PMOS transistor M4a, then the output signal (Vout) of the comparator 426 is a low voltage signal related to a logic zero (0) voltage value. In some instances, the PMOS transistor M4a and the NMOS transistor M5a may have similar drive strengths.

The transmission gate x1 is coupled between the PMOS transistor M4a and the positive input terminal (+) of the comparator 426. The transmission gate x1 may be biased with a first clock signal (ph1b) and a second clock signal (ph1). The first clock signal (ph1b) may be the inverted signal of the second clock signal (ph1). Further, NMOS transistor M7a is coupled between the transmission gate x1 and the second voltage source Vss, and the NMOS transistor M7a is activated with a first clock signal (ph1b).

The transmission gate x2 is coupled between the NMOS transistor M5a and the negative input terminal (−) of the comparator 426. The transmission gate x2 may be biased with a first clock signal (ph1b) and a second clock signal (ph1). Further, NMOS transistor M8 is coupled between the transmission gate x2 and the second voltage source Vss, and the NMOS transistor M8 is activated with the first clock signal (ph1b).

In some implementations, FIG. 4 shows a schematic representation of a first sensor circuit 420 (e.g., PN skew). This circuit 420 uses a reference current, IREF, which is mirrored (Imir) into transistors M3 and M6a to remove charge from nodes V1a and V2. The node V1a is coupled to the diode-connected PMOS transistor M4a, and the node V2 is coupled to a diode-connected NMOS transistor M5a. Both transistors M4a and M5a operate in the saturation region and are designed to have similar (or equal) drive strengths. The reference current IREF is chosen (e.g., for typical silicon) such that the voltages on nodes V1a and V2 are approximately similar or equal (V1~V2). Then, in this configuration, the current mirror device M3 or M6 is skewed by 1 LSB value of the reference current IREF such that the output (Vout) of the comparator 426 is low. With this default setting, it may represent a typical silicon skew between P and N. Since the P and N devices vary during manufacturing process, depending on how much the skew offset between the P and N, it may take either more current or less current to switch the comparator 426. The number of steps in current change, IREF, to switch the comparator 426 may be directly proportional to the difference in strength between the P and N devices. Hence, this output information (Vout) refers to a skew difference between the two devices M4a, M5a.

As shown in FIG. 5, the process sensor 520 may include multiple transistors that are arranged to operate as a CMOS FF-SS (fast, slow) process skew sensor.

The process sensor 520 may include a current mirror 522. The process sensor 520 may include the current reference IREF and the transistors M0, M1, M1a, M2, M3 that are arranged in a similar manner as shown in FIG. 4. The process sensor 520 may include PMOS transistor M4*b* and NMOS transistor M5*b* coupled in parallel between the NMOS transistor M3 and in series with PMOS transistor M6*b*. The gate of the PMOS transistor M4*b* is coupled to the second voltage source Vss, and the gate of the NMOS transistor M5*b* is coupled to the first voltage source Vdd. The PMOS transistor M6*b* is coupled between the first voltage source Vdd and the transistors M4*b*, M5*b*. The PMOS transistor M6*b* is activated based on a selection signal (selb).

The process sensor 520 may include a process skew detector 524 and a comparator 526. The process sensor 520 includes PMOS transistor M4*b* and NMOS transistor M5*b* which operate in the linear region. The CMOS transmission gate x3 includes an NMOS pass gate and a PMOS pass gate. The signals ph1 and ph1*b* are clock signals with phase1 and phase1 bar. When ph1=1 and ph1*b*=0, the transmission gate x3 is open and allows the V1*b* signal to pass through. When ph1=0 and ph1*b*=1, the transmission gate x3 is closed and no signal can pass through. The third process skew detector 524 provides a third drive strength signal V1*b*, V3*b* to a positive input terminal (+) of the comparator 526 based on the detected drive strength of transistors M4*b* and M5*b*. Further, a voltage reference signal Vref is coupled to a negative input terminal (−) of the comparator 526.

The transmission gate x3 is coupled between the transistors M4*b*, M5*b* and the positive input terminal (+) of the comparator 526. The transmission gate x3 may be biased with the first clock signal (ph1*b*) and the second clock signal (ph1). The first clock signal (ph1*b*) is the inverted signal of the second clock signal (ph1). NMOS transistor M7*b* is coupled between the transmission gate x3 and the second voltage source Vss, and the NMOS transistor M7*b* is activated with the first clock signal (ph1*b*).

The comparator 526 receives the third drive strength signal V3*b* and a reference voltage signal Vref that is based on the reference current IREF. If the strength of the third drive strength signal V3*b* from the transmission gate x3 is stronger than the strength of the reference voltage signal Vref, then an output signal (Vout) from the comparator 526 is a high voltage signal related to a logic one (1) voltage value. If the strength of the reference voltage signal Vref is stronger than the strength of the third drive strength signal V3*b* from the transmission gate x3, then the output signal (Vout) of the comparator 526 is a low voltage signal related to a logic zero (0) voltage value.

In some implementations, FIG. 5 shows a schematic representation of a second sensor circuit 520 (e.g., a FF-SS skew). One principle of circuit 520 is to use the transistors M4*b* and M5*b* operating in the linear region so as to drive node V1*b* and to use a variable current reference IREF to sense FF or SS process corners and to determine an amount by which the process is skewed. As an example, the sizing of the transistors M4*b* and M5*b* may be chosen with one or more digital values close to a transmission gate used in a flip-flop (e.g., W4=W5=200 nm). The transistors in the current mirror (M0-M3) are "analog sizes" to minimize their process variation. Depending on whether testing is to be performed on memory bit cell variation or logic cell variation, the device sizes of M4 and M5 are chosen accordingly. Also, these devices M4 and M5 may be arranged in a series or parallel configuration to get a desired variation.

In some implementations, the reference current IREF may be selected (e.g., from TYPICAL silicon data) such that the voltage on node V1*b* is greater (>) than the reference voltage Vref and the output of the comparator 526 is high. In some situations, when the transistor drive strength changes due to manufacturing variation, the amount of current required to trip the comparator 526 may also change accordingly. How much the silicon is faster or slower may be found by sweeping the reference current IREF using a DAC and determining the digital code required to trip the comparator 526.

Figure 6:
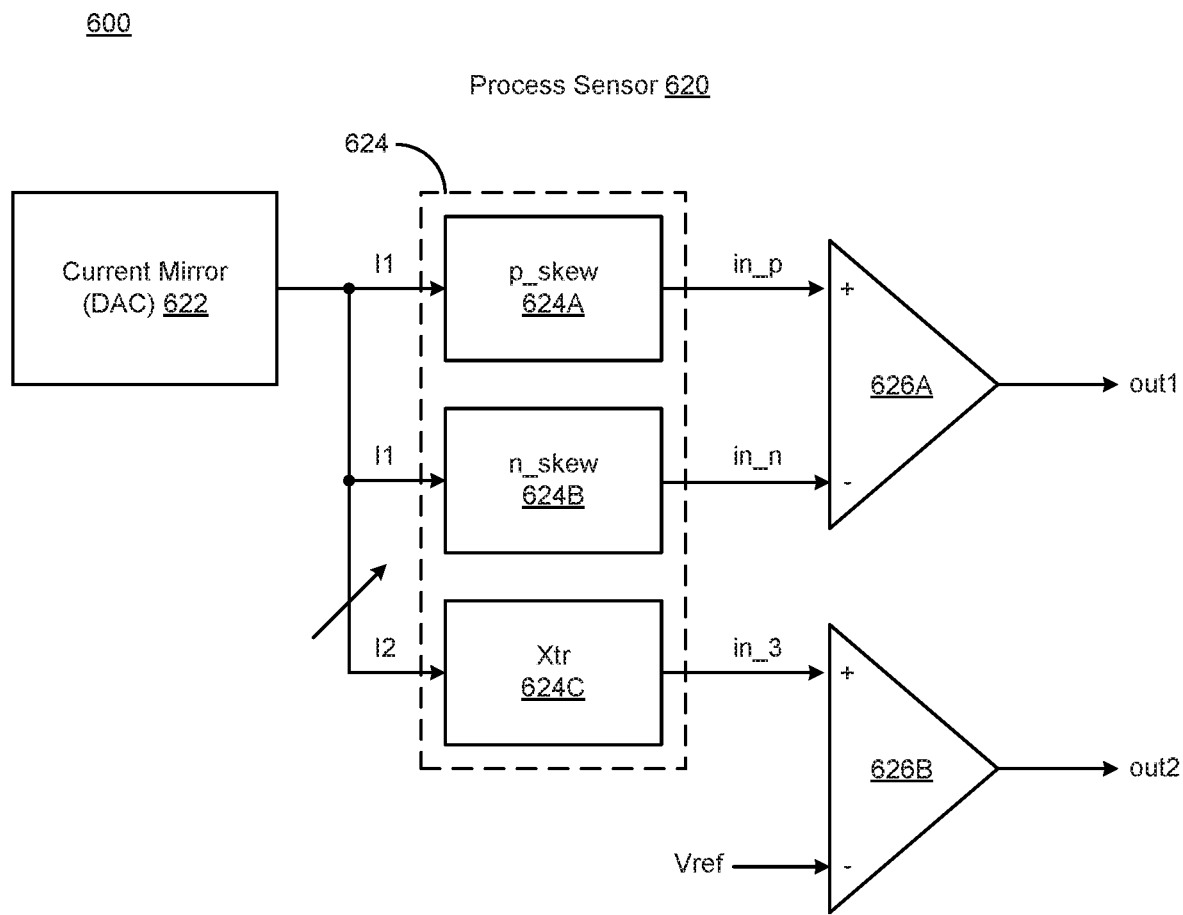
FIG. 6 illustrates a block diagram of another process sensor in accordance with various implementations described herein.

FIG. 6 illustrates a block diagram 600 of a process sensor 620 in accordance with various implementations described herein. The process sensor 620 may refer to a process skew sensor, such as, e.g., a CMOS process skew sensor.

The process sensor or process skew sensor 620 may include a digital-to-analog converter (DAC) 622 that operates to provide a drive current (I1, I2). The DAC 622 may operate as a current mirror to provide the drive current (I1, I2).

The process skew sensor 620 may include a first process skew detector 624A (p_skew) that detects a strength of the drive current (I1) with a PMOS transistor that operates in saturation region. The first process skew detector 624A provides a first drive strength signal (in_p) based on the detected drive strength of the PMOS transistor.

The process skew sensor 620 may include a second process skew detector 624*b* (n_skew) that detects a strength of the drive current (I1) with an NMOS transistor that operates in saturation region. The second process skew detector 624*b* (n_skew) provides a second drive strength signal (in_n) based on the detected drive strength of the NMOS transistor.

The process skew sensor 620 may include a third process skew detector 624C (Xtr) having a transmission gate that operates in linear region using the drive current (I2). The third process skew detector 624C (Xtr) provides a third drive strength signal (in_3) based on the detected drive strength of the transmission gate.

The process skew sensor 620 may include a first comparator 626A that receives the first and second drive strength signals (in_p, in_n) from the first and second process skew detectors 624A (p_skew), 624B (n_skew), detects a first voltage difference between the first and second drive strength signals, and provides a first output signal (out1) based on the detected first voltage difference. The first comparator 626A may be a first analog comparator, and the detected first voltage difference is related to a difference in strength between the first and second drive strength signals (in_p, in_n), and thereby the first output signal (out1) is indicative of the difference in strength between the first and second drive strength signals (in_p, in_n). The first comparator 626A receives the first and second drive strength signals (in_p, in_n). If the first drive strength signal (in_p) from the PMOS transistor is stronger than the second drive strength signal (in_n) from the NMOS transistor, then the first output signal (out1) from the first comparator 626A is a high voltage signal related to a logic one (1) voltage value. If the second drive strength signal (in_n) from the NMOS transistor is stronger than the first drive strength signal (in_p) from the PMOS transistor, then the first output signal (out1) of the first comparator 626A is a low voltage signal related to a logic zero (0) voltage value.

The process skew sensor 620 may include a second comparator 626B that receives the third drive strength signal (in_3) and a reference voltage signal (Vref), detects a second voltage difference between the third drive strength signal (in_3) and the reference voltage signal (Vref), and provides a second output signal (out2) based on the detected second voltage difference. The second comparator 626B may be a second analog comparator. The detected second voltage difference is related to a difference in strength between the third drive strength signal (in_3) and the reference voltage signal (Vref), and thereby the second output signal (out2) is indicative of the difference in strength between the third drive strength signal (in_3) and the reference voltage signal (Vref). In some cases, if the third drive strength signal (in_3) from the transmission gate is stronger than the strength of the reference voltage signal (Vref), then the second output signal (out2) from the second comparator 626B is a high voltage signal related to a logic one (1) voltage value. In some other cases, if the strength of the reference voltage signal (Vref) is stronger than the third drive strength signal (in_3) from the transmission gate, then the second output signal (out2) of the second comparator 626B is a low voltage signal related to a logic zero (0) voltage value.

In some implementations, FIG. 6 shows a schematic representation of a top-level architecture of the process skew sensor 620, which may be referred to as a CMOS process skew sensor. The DAC and the current mirror block 622 may be shared between the two comparators 626A, 626B. The output (out1) of the first comparator 626A may provide FS/SF (fast-slow, slow-fast) information, and the output (out2) of the second comparator 626B may provide FF/SS (fast-fast, slow-slow) silicon skew information.

The various implementations described herein may be used with an Adaptive Voltage Scaling (AVS) technique that uses a chips' exact process corner which is determined by a manufacturing test or determined during runtime, and an appropriate voltage-frequency relationship may be determined. In some instances, Adaptive Voltage Scaling (AVS) may refer to a closed-loop dynamic power minimization technique that reduces power based on actual operating conditions of a chip, wherein power consumption may be continuously adjusted during run time of a chip.

Figure 7:
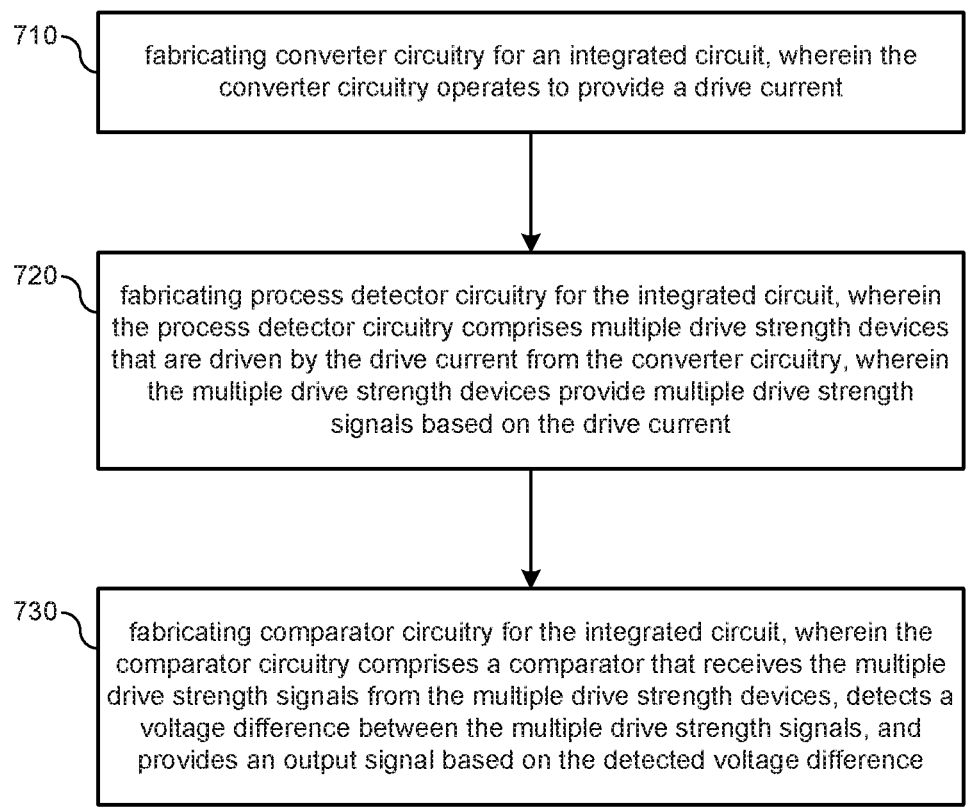
FIG. 7-8 illustrate various process flow diagrams of methods for fabricating a process sensor in accordance with various implementations described herein.

FIG. 7 illustrates a process flow diagram of method 700 for fabricating an integrated circuit in accordance with various implementations described herein.

It should be understood that even though method 700 may indicate a particular order of operation execution, various certain portions of the operations may be executed in a different order, and on different systems. In some instances, additional operations or steps may be added to and/or omitted from method 700. Further, method 700 may be implemented in hardware and/or software. If implemented in hardware, method 700 may be implemented with various circuit components, such as described above in reference to FIGS. 1-6. If implemented in software, the method 700 may be implemented as a program or software instruction process that may be configured for fabricating a process skew sensor as described herein. Also, if implemented in software, instructions related to implementing method 700 may be stored in memory and/or a database. For instance, a computer or various other computing devices having a processor and memory may be configured to perform method 700.

In reference to FIG. 7, method 700 may be utilized for manufacturing and/or fabricating an integrated circuit. At block 710, method 700 may fabricate converter circuitry for the integrated circuit, and the converter circuitry may operate to provide a drive current. At block 720, method 700 may fabricate process detector circuitry for the integrated circuit. The process detector circuitry may include multiple drive strength devices that are driven by the drive current from the converter circuitry, and the multiple drive strength devices may provide multiple drive strength signals based on the drive current. At block 730, method 700 may fabricate comparator circuitry for the integrated circuit. The comparator circuitry may include a comparator that receives the multiple drive strength signals from the multiple drive strength devices, detects a voltage difference between the multiple drive strength signals, and provides an output signal based on the detected voltage difference.

Figure 8:
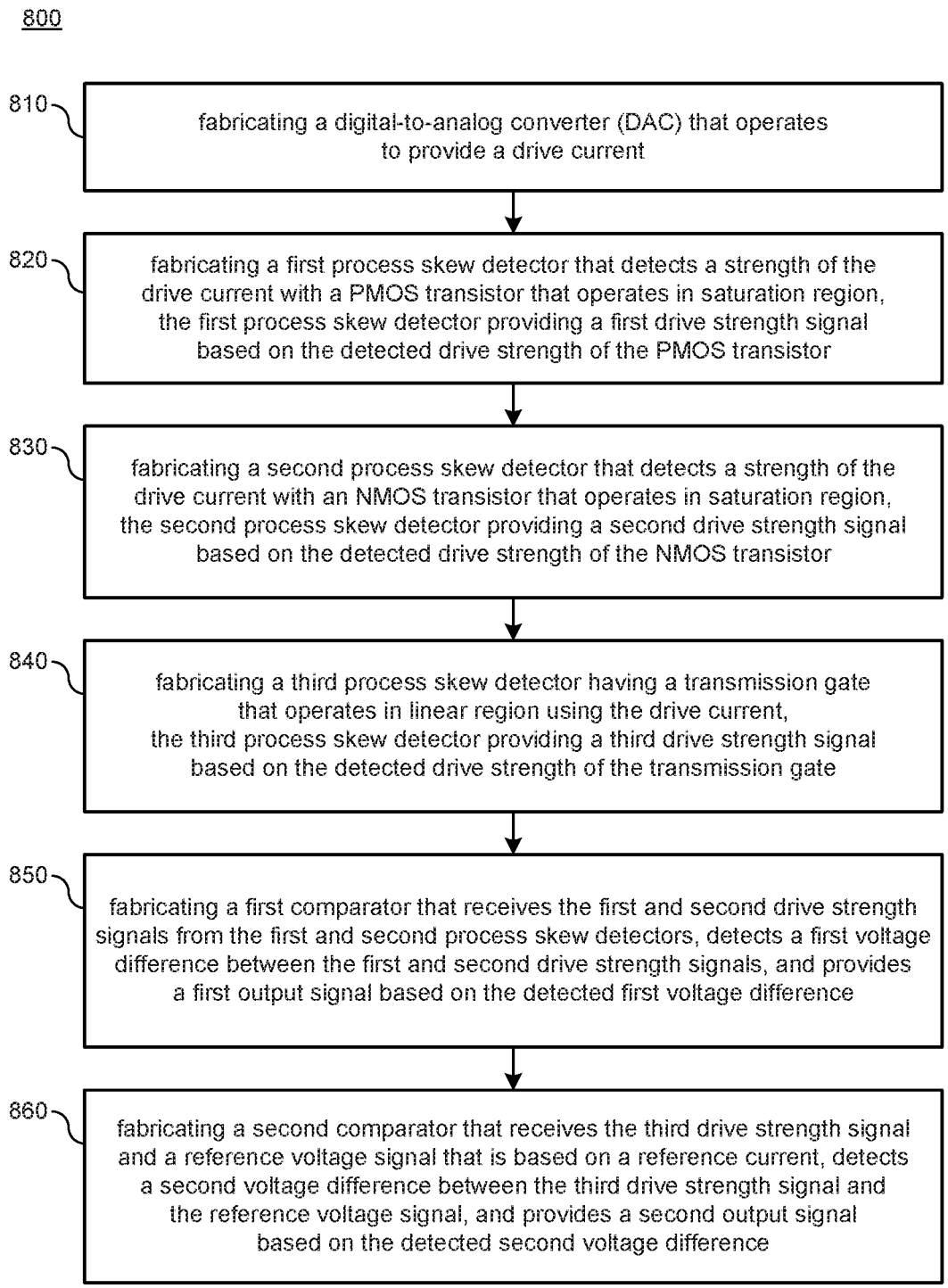

FIG. 8 illustrates a process flow diagram of method 800 for fabricating a process skew sensor in accordance with various implementations described herein.

It should be understood that even though method 800 may indicate a particular order of operation execution, various certain portions of the operations may be executed in a different order, and on different systems. In some instances, additional operations or steps may be added to and/or omitted from method 800. Further, method 800 may be implemented in hardware and/or software. If implemented in hardware, method 800 may be implemented with various circuit components, such as described above in reference to FIGS. 1-6. If implemented in software, the method 800 may be implemented as a program or software instruction process that may be configured for fabricating a process skew sensor as described herein. Also, if implemented in software, instructions related to implementing method 800 may be stored in memory and/or a database. For instance, a computer or various other computing devices having a processor and memory may be configured to perform method 800.

In reference to FIG. 8, method 800 may be utilized for manufacturing and/or fabricating a process skew sensor. At block 810, method 800 may fabricate a digital-to-analog converter (DAC) that operates to provide a drive current. At block 820, method 800 may fabricate a first process skew detector that detects a strength of the drive current with a PMOS transistor that operates in saturation region, and the first process skew detector may provide a first drive strength signal based on the detected drive strength of the PMOS transistor. At block 830, method 800 may fabricate a second process skew detector that detects a strength of the drive current with an NMOS transistor that operates in saturation region, and the second process skew detector may provide a second drive strength signal based on the detected drive strength of the NMOS transistor. At block 840, method 800 may fabricate a third process skew detector having a transmission gate that operates in linear region using the drive current, and the third process skew detector may provide a third drive strength signal based on the detected drive strength of the transmission gate. At block 850, method 800 may fabricate a first comparator that receives the first and second drive strength signals from the first and second process skew detectors, detects a first voltage difference between the first and second drive strength signals, and provides a first output signal based on the detected first voltage difference. At block 860, method 800 may fabricate a second comparator that receives the third drive strength signal and a reference voltage signal, detects a second voltage difference between the third drive strength signal and the reference voltage signal, and provides a second output signal based on the detected second voltage difference.

Described herein are various implementations of an integrated circuit. The integrated circuit may include converter circuitry that operates to provide a drive current. The integrated circuit may include process detector circuitry having multiple drive strength devices that are driven by the drive current from the converter circuitry. The multiple drive strength devices may provide multiple drive strength signals based on the drive current. The integrated circuit may include comparator circuitry having a comparator that receives the multiple drive strength signals from the multiple drive strength devices, detects a voltage difference between the multiple drive strength signals, and provides an output signal based on the detected voltage difference.

Described herein are various implementations of a process skew sensor. The process skew sensor may include a digital-to-analog converter (DAC) that operates to provide a drive current. The process skew sensor may include a first process skew detector that detects a strength of the drive current with a PMOS transistor that operates in saturation region, and the first process skew detector may provide a first drive strength signal based on the detected drive strength of the PMOS transistor. The process skew sensor may include a second process skew detector that detects a strength of the drive current with an NMOS transistor that operates in saturation region, and the second process skew detector may provide a second drive strength signal based on the detected drive strength of the NMOS transistor. The process skew sensor may include a third process skew detector having multiple transistors that operate in linear region using the drive current, and the third process skew detector may provide a third drive strength signal based on the detected drive strength of the multiple transistors. The process skew sensor may include a first comparator that receives the first and second drive strength signals from the first and second process skew detectors, detects a first voltage difference between the first and second drive strength signals, and provides a first output signal based on the detected first voltage difference. The process skew sensor may include a second comparator that receives the third drive strength signal and a reference voltage signal, detects a second voltage difference between the third drive strength signal and the reference voltage signal, and provides a second output signal based on the detected second voltage difference.

Described herein are various implementations of a method for manufacturing an integrated circuit. The method may include fabricating converter circuitry for the integrated circuit, and the converter circuitry may operate to provide a drive current. The method may include fabricating process detector circuitry for the integrated circuit, and the process detector circuitry may include multiple drive strength devices that are driven by the drive current from the converter circuitry. The multiple drive strength devices may provide multiple drive strength signals based on the drive current. The method may include fabricating comparator circuitry for the integrated circuit, and the comparator circuitry may include a comparator that receives the multiple drive strength signals from the multiple drive strength devices, detects a voltage difference between the multiple drive strength signals, and provides an output signal based on the detected voltage difference.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   converter circuitry that operates to provide a drive current;
   process detector circuitry having multiple drive strength devices that are driven by the drive current from the converter circuitry, wherein the multiple drive strength devices provide multiple drive strength signals based on the drive current; and comparator circuitry having a comparator that receives the multiple drive strength signals from the multiple drive strength devices, detects a voltage difference between the multiple drive strength signals, and provides an output signal based on the detected voltage difference wherein the converter circuitry comprises a digital-to-analog converter (DAC), and wherein the DAC operates as a current mirror to provide the drive current.

2. The integrated circuit of claim 1, wherein the integrated circuit comprises a process skew detector, and wherein the process skew detector comprises a complementary metal-oxide-semiconductor (CMOS) process skew detector.

3. The integrated circuit of claim 1, wherein the comparator comprises an analog comparator, and wherein the detected voltage difference is related to a difference in strength between the multiple drive strength signals, and wherein the output signal is indicative of the difference in strength between the multiple drive strength signals.

4. The integrated circuit of claim 1, wherein the multiple drive strength devices are implemented as multiple process skew detectors, and wherein the multiple process skew detectors comprise a first process skew detector and a second process skew detector.

5. The integrated circuit of claim 4, wherein the first process skew detector detects a strength of the drive current with a p-type metal-oxide-semiconductor (PMOS) transistor that operates in saturation region, and wherein the first process skew detector provides a first drive strength signal to the comparator based on the detected drive strength of the PMOS transistor, and wherein the second process skew detector detects a strength of the drive current with an n-type MOS (NMOS) transistor that operates in saturation region, and wherein the second process skew detector provides a second drive strength signal to the comparator based on the detected drive strength of the NMOS transistor.

6. The integrated circuit of claim 5, wherein the comparator receives the first and second drive strength signals, and wherein if the first drive strength signal from the PMOS transistor is stronger than the second drive strength signal from the NMOS transistor, then the output signal from the comparator is a high voltage signal related to a logic one (1) voltage value, and wherein if the second drive strength signal from the NMOS transistor is stronger than the first drive strength signal from the PMOS transistor, then the output signal of the comparator is a low voltage signal related to a logic zero (0) voltage value.

7. The integrated circuit of claim 5, wherein the PMOS transistor is coupled as a diode, and wherein the NMOS transistor is coupled as a diode.

8. The integrated circuit of claim 5, wherein the PMOS transistor and the NMOS transistor have similar drive strengths.

9. The integrated circuit of claim 4, wherein the multiple process skew detectors comprise a third process skew detector having multiple transistors that operate in linear region using the drive current, and wherein the third process skew detector provides a third drive strength signal to the comparator based on the detected drive strength of the multiple transistors.

10. The integrated circuit of claim 9, wherein the comparator receives the third drive strength signal and a reference voltage signal, and wherein if the third drive strength signal from the multiple transistors is stronger than the strength of the reference voltage signal, then the output signal from the comparator is a high voltage signal related to a logic one (1) voltage value, and wherein if the strength of the reference voltage signal is stronger than the third drive strength signal from the multiple transistors, then the output signal of the comparator is a low voltage signal related to a logic zero (0) voltage value.

11. A process skew sensor, comprising:

a digital-to-analog converter (DAC) that operates to provide a drive current;

a first process skew detector that detects a strength of the drive current with a p-type metal-oxide-semiconductor (PMOS) transistor that operates in saturation region, the first process skew detector providing a first drive strength signal based on the detected drive strength of the PMOS transistor;

a second process skew detector that detects a strength of the drive current with an n-type MOS (NMOS) transistor that operates in saturation region, the second process skew detector providing a second drive strength signal based on the detected drive strength of the NMOS transistor;

a third process skew detector having multiple transistors that operate in linear region using the drive current, the third process skew detector providing a third drive strength signal based on the detected drive strength of the multiple transistors;

a first comparator that receives the first and second drive strength signals from the first and second process skew detectors, detects a first voltage difference between the first and second drive strength signals, and provides a first output signal based on the detected first voltage difference; and a second comparator that receives the third drive strength signal and a reference voltage signal, detects a second voltage difference between the third drive strength signal and the reference voltage signal, and provides a second output signal based on the detected second voltage difference.

12. The process skew sensor of claim 11, wherein the process skew sensor comprises a complementary metal-oxide-semiconductor (CMOS) process skew sensor.

13. The process skew sensor of claim 11, wherein the DAC operates as a current mirror to provide the drive current.

14. The process skew sensor of claim 11, wherein the first comparator comprises a first analog comparator, and wherein the detected first voltage difference is related to a difference in strength between the first and second drive strength signals, and wherein the first output signal is indicative of the difference in strength between the first and second drive strength signals.

15. The process skew sensor of claim 11, wherein the first comparator receives the first and second drive strength signals, and wherein if the first drive strength signal from the PMOS transistor is stronger than the second drive strength signal from the NMOS transistor, then the first output signal from the first comparator is a high voltage signal related to a logic one (1) voltage value, and wherein if the second drive strength signal from the NMOS transistor is stronger than the first drive strength signal from the PMOS transistor, then the first output signal of the first comparator is a low voltage signal related to a logic zero (0) voltage value.

16. The process skew sensor of claim 11, wherein the PMOS transistor is coupled as a diode, and wherein the NMOS transistor is coupled as a diode, and wherein the PMOS transistor and the NMOS transistor have similar drive strengths.

17. The process skew sensor of claim 11, wherein the second comparator comprises a second analog comparator, and wherein the detected second voltage difference is related to a difference in strength between the third drive strength signal and the reference voltage signal, and wherein the second output signal is indicative of the difference in strength between the third drive strength signal and the reference voltage signal.

18. The process skew sensor of claim 11, wherein if the third drive strength signal from the multiple transistors is stronger than the strength of the reference voltage signal, then the second output signal from the second comparator is a high voltage signal related to a logic one (1) voltage value, and wherein if the strength of the reference voltage signal is stronger than the third drive strength signal from the multiple transistors, then the second output signal of the second comparator is a low voltage signal related to a logic zero (0) voltage value.

19. A method of manufacturing an integrated circuit, comprising:
  fabricating converter circuitry for the integrated circuit, wherein the converter circuitry operates to provide a drive current;
  fabricating process detector circuitry for the integrated circuit, wherein the process detector circuitry comprises multiple drive strength devices that are driven by the drive current from the converter circuitry, wherein the multiple drive strength devices provide multiple drive strength signals based on the drive current, and wherein the multiple drive strength devices comprise:
    a first process skew detector that detects a strength of the drive current with a p-type metal-oxide-semiconductor (PMOS) transistor; and
    a second process skew detector that detects a strength of the drive current with an n-type MOS (NMOS) transistor; and
  fabricating comparator circuitry for the integrated circuit, wherein the comparator circuitry receives the multiple drive strength signals from the multiple drive strength devices, detects a voltage difference between the multiple drive strength signals, and provides an output signal based on the detected voltage difference.

20. The method of claim 19, wherein the multiple drive strength devices comprise a third process skew detector having multiple transistors that detects a drive strength of the multiple transistors, and the comparator circuitry comprise a plurality of comparators to detect the voltage difference between the multiple drive strength signals.

* * * * *